(12) United States Patent
Li et al.

(10) Patent No.: US 6,945,319 B1
(45) Date of Patent: Sep. 20, 2005

(54) SYMMETRICAL HEAT SINK MODULE WITH A HEAT PIPE FOR SPREADING OF HEAT

(75) Inventors: Nien-Lun Li, Hsin-Chuang (TW); To Hsu, Hsin-Chuang (TW); Cheng-Hsing Lee, Hsin-Chuang (TW); Hung-Chung Chu, Hsin-Chuang (TW)

(73) Assignee: Datech Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 10/937,281

(22) Filed: Sep. 10, 2004

(51) Int. Cl.[7] ............................................. F28D 15/00
(52) U.S. Cl. .............................. 165/104.33; 165/80.3; 165/185; 165/104.21
(58) Field of Search ............................... 165/185, 80.3, 165/104.33, 104.34, 104.21, 104.26; 361/697, 361/700, 702, 704; 257/714, 715; 174/15.2, 174/16.3

(56) References Cited

U.S. PATENT DOCUMENTS

| | | | |
|---|---|---|---|
| 5,901,040 A * | 5/1999 | Cromwell et al. | 361/704 |
| 6,189,601 B1 * | 2/2001 | Goodman et al. | 165/80.3 |
| 6,625,021 B1 * | 9/2003 | Lofland et al. | 361/697 |
| 6,779,595 B1 * | 8/2004 | Chiang | 165/104.33 |
| 2003/0141041 A1 * | 7/2003 | Chen | 165/80.3 |
| 2004/0035558 A1 * | 2/2004 | Todd et al. | 165/104.26 |
| 2005/0067144 A1 * | 3/2005 | Chou | 165/80.3 |

FOREIGN PATENT DOCUMENTS

JP        10303347 A  * 11/1998  ......... H01L 23/427

* cited by examiner

Primary Examiner—Tho v Duong
(74) Attorney, Agent, or Firm—Troxell Law Office, PLLC

(57) ABSTRACT

The present invention is a symmetrical heat sink module with a heat pipe for spreading of heat, comprising a first and a second sets of fins each with a first and a second heat dissipation areas where the first and the second heat dissipation areas each comprises corresponding concave parts; a curved heat pipe between the concave parts with the bottom being convex out of the bottom of the first and the second sets of fins; and a base at the convex bottom of the curved heat pipe. Accordingly, the first and the second sets of fins are corresponding to each other so that the heat sink module obtains larger heat dissipation area and the function of two-side dissipation to achieve better heat dissipation efficiency.

12 Claims, 6 Drawing Sheets

SYMMETRICAL HEAT SINK MODULE WITH A HEAT PIPE FOR SPREADING OF HEAT

FIELD OF THE INVENTION

The present invention relates to a heat sink module; more particularly, relates to forming two symmetrical sets of fins in the module to get larger heat dissipation area and to dissipate heat at both sides so that a better heat dissipation efficiency is achieved.

DESCRIPTION OF THE RELATED ART

The prior art of "Heat sink apparatus" as disclosed in U.S. Pat. No. 6,525,939 comprising: a fan comprising at least one attachment hole; a heat sink module mounted on the CPU, comprising a metal heat conduction column, a plurality of arc-shaped cooling fins radiating from the edge of the metal heat conduction column and a plurality of mounting holes positioned at the ends of the arc-shaped cooling fins, corresponding to the attachment holes; and a latch comprising a latch arm, a plurality of openings and at least one latch hole.

Therein, the latch arm is secured to the socket of the CPU; each of the openings correspond to the mounting holes and the attachment holes; the fan and the heat sink module are mounted onto the CPU with the latch; and the metal heat conduction column is a cylinder in direct contact with the CPU and is hollowed out as being filled with a metal having a heat conductibility that is better than the heat conductibility of the metal of the column.

Although the prior art mentioned above is able to dissipate heat by a heat sink module, the heat sink module is formed as a unity with limited dissipation area so that the heat dissipation efficiency is limited. So, the prior art can not fulfill the requirements from the user on actual use.

SUMMARY OF THE INVENTION

Therefore, the main purpose of the present invention is to form a first set of fins and a second set of fins to be symmetrical in the module to get larger heat dissipation area so that a better heat dissipation efficiency is achieved.

Another purpose of the present invention is to form the first set of fins and the second set of fins to be symmetrical in the module to dissipate heat at two sides so that a better heat dissipation efficiency is achieved.

To achieve the above purposes, the present invention is a symmetrical heat sink module with a heat pipe for spreading of heat, comprising a first and a second sets of fins symmetrically formed; a curved (U-type) heat pipe between the two sets of fins; and a base at the bottom of the curved heat pipe. The two sets of fins comprise a first heat dissipation area at the bottom of each set of fins; a second heat dissipation area on a surface of each set of fins near the first heat dissipation area; two vicinal concave parts on the opposite surface of each set of fins where the two sets of fins are combined by the two surfaces having the concave parts. The curved heat pipe is deposited in the concave parts of the two sets of fins; and the bottom of the curved heat pipe is convex out of the bottom of the two sets of fins. The base is deposited at the convex bottom of the curved heat pipe, and comprises a connection part corresponding to the bottom of the curved heat pipe. So, by the first and second sets of fins formed symmetrically, the heat sink module gains larger heat dissipation area and the ability of heat dissipation at two sides to achieve better heat dissipation.

BRIEF DESCRIPTIONS OF THE DRAWINGS

The present invention will be better understood from the following detailed description of preferred embodiments of the invention, taken in conjunction with the accompanying drawings, in which FIG. 1 is a perspective view according to an embodiment of the present invention;

DESCRIPTION OF THE PREFERRED EMBODIMENT

The following descriptions of the preferred embodiments are provided to understand the features and the structures of the present invention.

Figure 1:
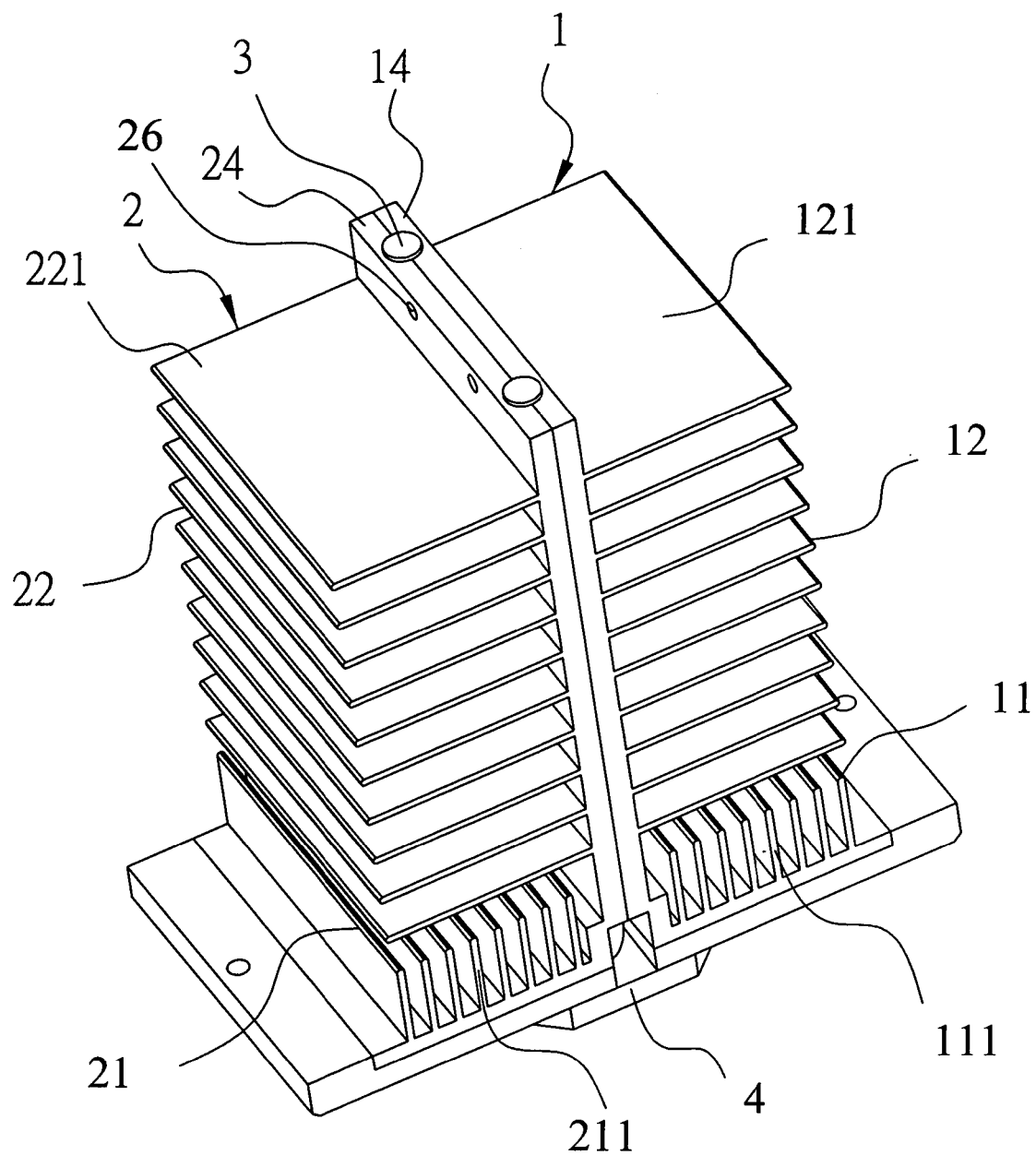
Figure 2:
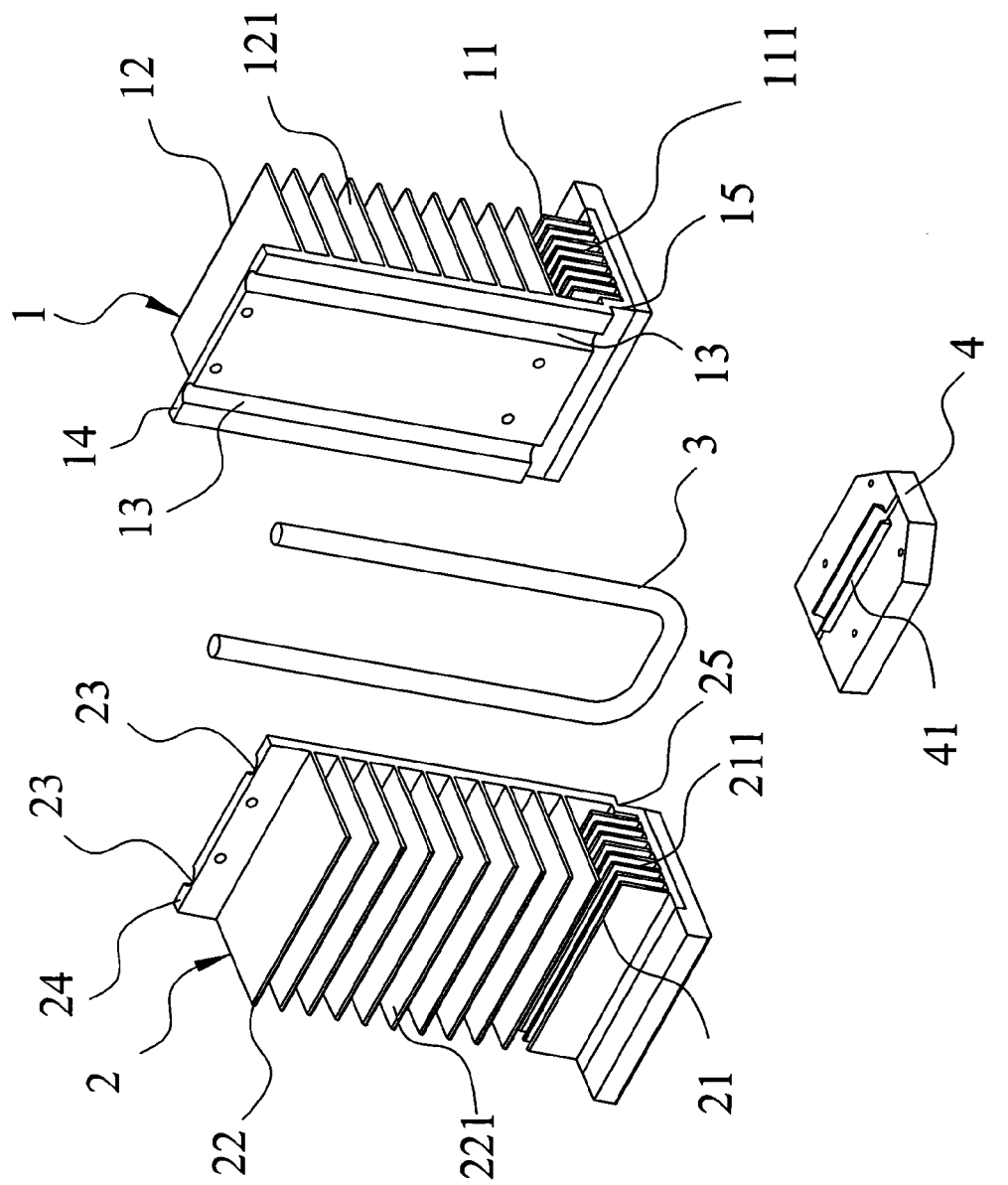
FIG. 2 is an exploded view showing the structure according to an embodiment of the present invention.
Figure 3:
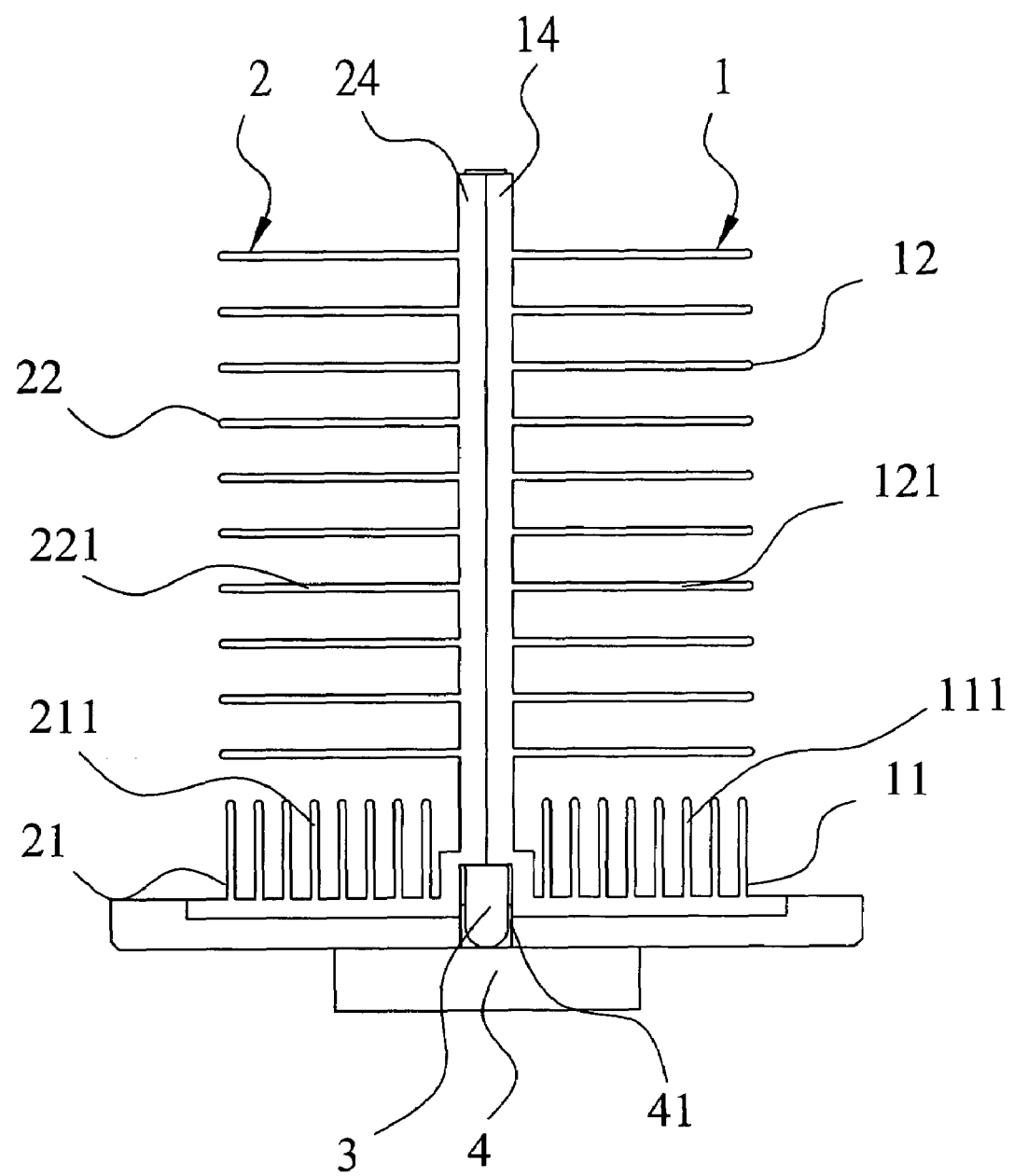
FIG. 3 is a side view according to an embodiment of the present invention.

Please refer to FIG. 1 through FIG. 3, which are a perspective view, an exploded view showing the structure and a side view, according to an embodiment of the present invention. As shown in the figures, the present invention is a symmetrical heat sink module with a heat pipe for spreading of heat, comprising a first set 1 of fins, a second set 2 of fins. a heat pipe 3 and a base 4. The first and the second sets 1,2 of fins are made of alumni, copper, alumni alloy or copper alloy which has better heat dissipation capability.

The first set 1 of fins comprises a first dissipation area 11 at the bottom, which is extended up from the bottom toward an end. A second dissipation area 12 is on a surface of the first set 1 of fins near the first dissipation area 11 extended outwardly from the surface of the first set 1 of fins. The first and the second dissipation areas 11,12 comprise a plurality of fins 111,121. And, the first set 1 of fins comprises two vicinal concave parts 13 on the opposite surface, a combination part 14 at an end, and an indentation 15 at the edge of the bottom.

The second set 2 of fins is symmetrical to the first set 1 of fins and comprises a first dissipation area 21 at the bottom which is extended up from the bottom toward an end. A second dissipation area 22 is on a surface of the second set 2 of fins near the first dissipation area 21 extended outwardly from the surface of the second set 2 of fins. The first 21 and the second 22 dissipation areas comprise a plurality of fins 211,221. And, the second set 2 of fins comprises: two vicinal concave parts 23 on the opposite surface to the surface having first dissipation area 21 where the first 1 and the second 2 sets of fins are combined by the surfaces having concave parts 13,23; a combination part 24 at an end, corresponding to the combination part 14 of the first set 1 of fins to combine the two sets of fins by a rivet member 26; and an indentation 25 corresponding to the indentation 15 of the first set 1 of fins at the edge of the bottom of the second set 2 of fins.

The heat pipe 3 is deposited in the concave parts 13,23 of the first and the second sets 1,2 of fins; and an end of the heat pipe 3 is convex out of the corresponding concave parts at the bottom of the first 1 and the second 2 sets of fins. The heat pipe 3 can be a U-type heat pipe capable of capillarity with liquid inside; or can be a loop heat pipe.

The base 4 is deposited at the convex part of the end of the heat pipe 3 and is made of alumni, copper, alumni alloy or copper alloy which has better heat dissipation capability. The base 4 includes a connection part 41 which is corresponding to the convex part at the end of the heat pipe 3. By the above structure, a novel symmetrical heat sink module with a heat pipe for spreading of heat is obtained.

Figure 4:
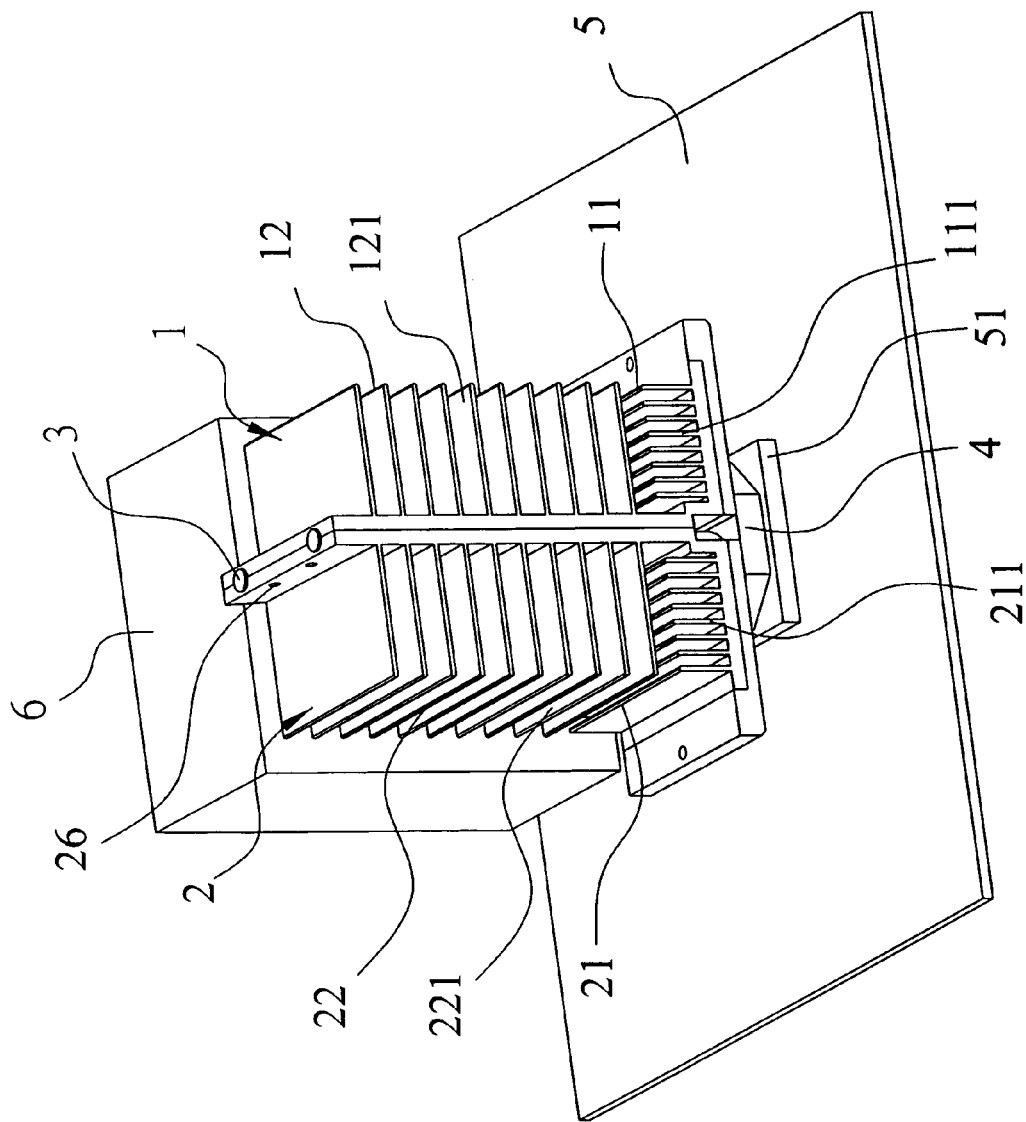
FIG. 4 is a view showing the status of use according to an embodiment of the present invention.
Figure 5:
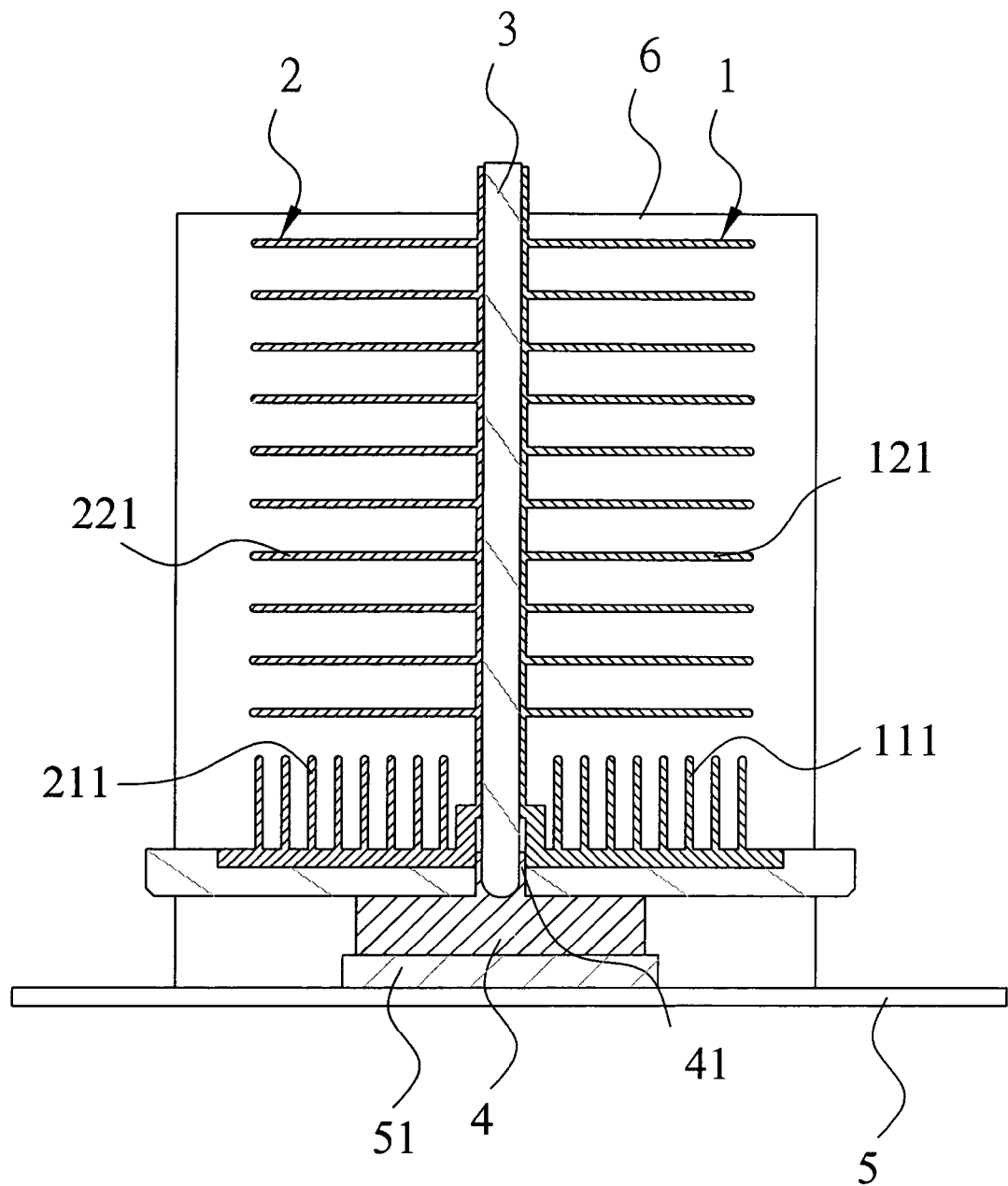
FIG. 5 is a sectional view showing the status of use according to an embodiment of the present invention.
Figure 6:
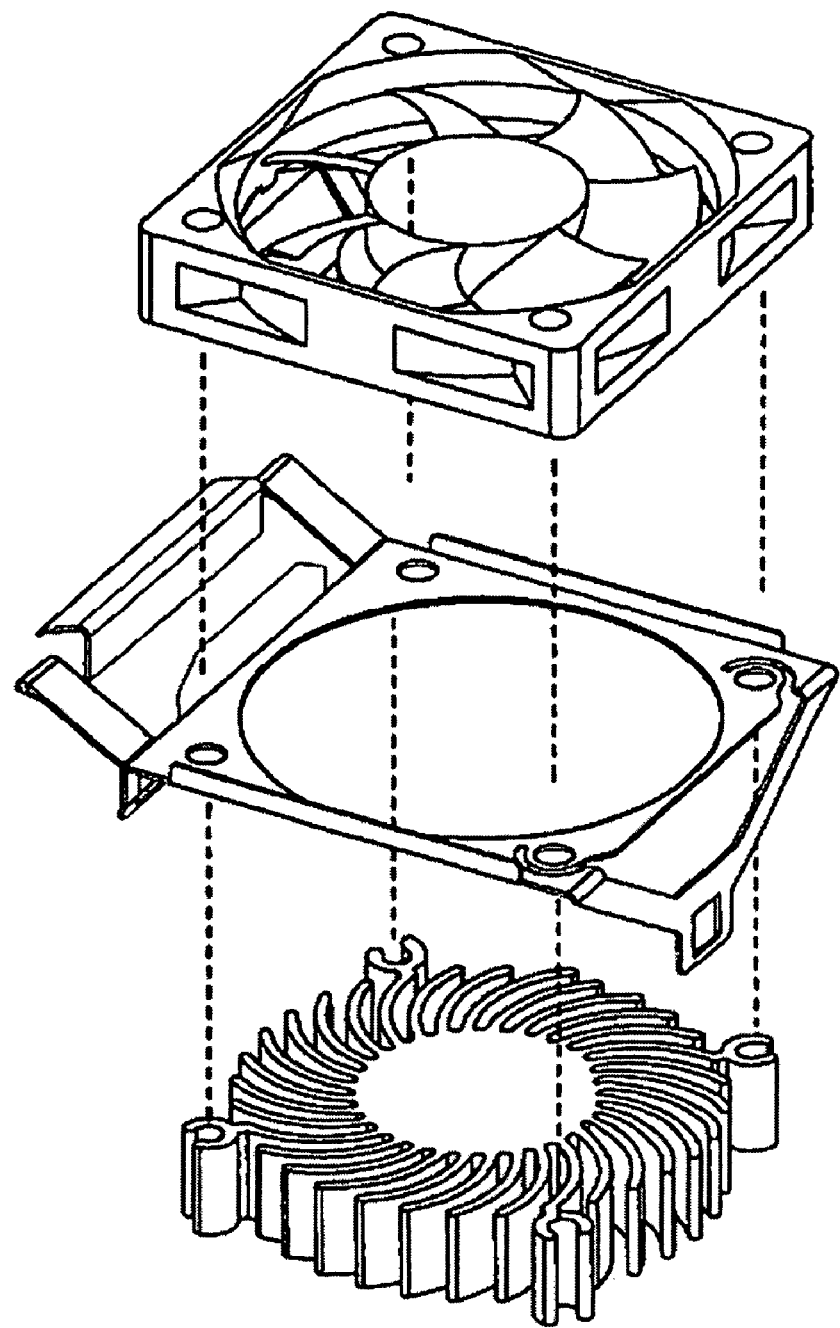
FIG. 6 is an exploded view showing the structure according to an embodiment of the prior art.

Please refer to FIG. 4 and FIG. 5, which are a view showing the status of use and a sectional view showing the status of use, according to an embodiment of the present invention. As shown in the figures, on using, the base 4 of the embodiment according to the present invention can be put on the heating component 51 which can be the CPU on the main board 5. A fan 6 can be set at a side of the present invention to blow wind at a side. Once the heating component 51 on the main board 5 is activated, the heating component 51 keeps generating heat. At the time, the base 4 starts absorbing the heat so that a part of the heat is transmitted to the first dissipation areas 11,21 to be dissipated through the first and the second sets 1,2 of fins. And some other part of the heat generated is transmitted to the heat pipe 3 through the base 4. And then, the heat is transmitted to the second dissipation areas 12,22 at a side of the first and the second sets 1,2 of fins so that the heat can be dissipated through the second dissipation areas 12,22 coordinated with a fan 6. When the heat is carried out by the wind generated by the fan at a side, the wind with heat will be guided to an end of a computer case (not shown in the figures). In this way, the wind with heat can be exhausted by the fan on the computer case so that thermal cycling will not happen in the computer case by the wind with heat. By doing so, the first and the second sets of fins are corresponding to each other so that the heat sink module obtains larger heat dissipation area and the function of two-side dissipation to achieve better heat dissipation efficiency.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A symmetrical heat sink module with a heat pipe for spreading of heat, comprising a first set of fins, a second set of fins, a curved heat pipe and a base, said first set of fins comprising:

(1) a first heat dissipation area at an end of said first set of fins;
   (2) a second heat dissipation area on a surface of said first set of fins near said first heat dissipation area; and
   (3) two vicinal concave parts shaped on the opposite surface to said surface of said first set of fins, said second set of fins comprising:

(1) a first heat dissipation area at an end of said second set of fins;
   (2) a second heat dissipation area on a surface of said second set of fins near said first heat dissipation area; and
   (3) two vicinal concave parts shaped on the opposite surface to said surface of said second set of fins, which are corresponding to said two vicinal concave parts of said first set of fins;

said curved heat pipe comprising a curved part convex out of said end of said first set of fins and said end of said second set of fins;
   said base comprising a connection part corresponding to said curved part of said curved heat pipe;
   wherein said curved heat pipe is deposited between said concave parts of said first set of fins and said concave parts of said second set of fins; and
   wherein said base is deposited at said convex bottom of said curved heat pipe.

2. The symmetrical heat sink module according to claim 1, wherein said second set of fins is corresponding to said first set of fins.

3. The symmetrical heat sink module according to claim 1, wherein said first heat dissipation areas of said first and said second sets of fins are vertically extended from said end of said first and said second sets of fins.

4. The symmetrical heat sink module according to claim 1, wherein said second heat dissipation area of said first and said second sets of fins are extended out from a surface of said first and said second sets of fins.

5. The symmetrical heat sink module according to claim 1, wherein said first and said second sets of fins are made of materials with heat dissipation ability, selected from a group consisting of alumni, copper, alumni alloy and copper alloy.

6. The symmetrical heat sink module according to claim 1, wherein said first and said second heat dissipation areas comprises a plurality of fins.

7. The symmetrical heat sink module according to claim 1, wherein an end of said first sets of fins and an end of said second sets of fins each comprise a corresponding combination part.

8. The symmetrical heat sink module according to claim 1, wherein said first and said second sets of fins each comprises an indentation at an edge of an end surface of each set of fins to contain said convex curved part of said curved heat pipe.

9. The symmetrical heat sink module according to claim 1, wherein said curved heat pipe is a U-type heat pipe.

10. The symmetrical heat sink module according to claim 1, wherein said curved heat pipe is a pipe capable of capillarity with liquid inside.

11. The symmetrical heat sink module according to claim 1, wherein said curved heat pipe is a loop heat pipe.

12. Symmetrical heat sink module according to claim 1, wherein said base are made of materials with heat dissipation ability selected from a group consisting of alumni, copper, alumni alloy and copper alloy.

* * * * *